(12) United States Patent
Akagi et al.

(10) Patent No.: US 6,317,004 B1
(45) Date of Patent: Nov. 13, 2001

(54) PLL CIRCUIT WHICH QUICKLY ADJUSTS VCO BIAS VOLTAGES

(75) Inventors: Hidemori Akagi; Masao Uno, both of Ishikawa-ken (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 09/467,907

(22) Filed: Dec. 21, 1999

(30) Foreign Application Priority Data

Dec. 21, 1998 (JP) .................................................. 10-362537

(51) Int. Cl.[7] .............................. H03L 7/08; H03L 7/099; G01R 23/00
(52) U.S. Cl. ................................ 331/17; 331/44; 455/260
(58) Field of Search .................................. 331/14, 17, 18, 331/25, 44; 327/156–159; 455/260

(56) References Cited

U.S. PATENT DOCUMENTS

| | | | |
|---|---|---|---|
| 4,484,153 | * 11/1984 | Borras et al. | 331/10 |
| 4,562,411 | * 12/1985 | O'Rourke et al. | 331/1 A |
| 5,389,899 | * 2/1995 | Yahagi et al. | 331/10 |
| 5,736,904 | * 4/1998 | Humphreys et al. | 331/10 |

* cited by examiner

Primary Examiner—David Mis
(74) Attorney, Agent, or Firm—Burns, Doane, Swecker & Mathis, LLP

(57) ABSTRACT

In the path from the output of a charging pump to a control voltage terminal including the inside of a loop filter, voltage application means for applying a direct-current voltage of a predictable value to the control voltage terminal is given, resulting in a PLL circuit. In the PLL circuit, first, a fixed direct-current voltage is applied to the control voltage terminal from the voltage application means. The oscillation frequency of a voltage-controlled oscillator may be adjusted by making use of a trimming area as a oscillation frequency adjustment mechanism. Therefore, the oscillation frequency of the voltage-controlled oscillator can be quickly adjusted using fewer pieces of equipment.

25 Claims, 4 Drawing Sheets

PLL CIRCUIT WHICH QUICKLY ADJUSTS VCO BIAS VOLTAGES

BACKGROUND OF THE INVENTION

1. Field of the Invention

The present invention relates to a Phase Locked Loop (PLL) circuit, a communication device using the PLL circuit, and a frequency adjustment method of a PLL circuit. More particularly, the present invention relates to a PLL circuit to be used in a portable communication apparatus, a communication device using the PLL circuit, and a frequency adjustment method of a PLL circuit.

2. Description of the Related Art

In portable communication apparatus such as a portable telephone, and so on, a PLL circuit is used as a local oscillator which is stable in frequency.

In FIG. 7, the block diagram of a known conventional PLL circuit is shown. In FIG. 7, a PLL circuit 1 is composed of a voltage-controlled oscillator 2, a TCXO (temperature compensation crystal oscillator) 3, frequency dividers 4 and 5, a phase comparator 6, a charging pump 7, and a loop filter 8. The voltage-controlled oscillator 2 is composed of an amplifier portion 2a, a resonance circuit portion 2b, a varactor diode VD in the resonance circuit portion 2b, and a trimming area 2c as an oscillation frequency adjustment mechanism. The trimming area 2c is formed of, for example, an electrode constituting a part of a resonance system. The resonance frequency of the resonance circuit portion 2b is changed by cutting and trimming the electrode and, accordingly, the oscillation frequency of the voltage-controlled oscillator 2 can be adjusted. The voltage-controlled oscillator 2 is provided with a control voltage terminal 2d for changing the oscillation frequency by applying a direct-current voltage to the varactor diode VD.

The output of the voltage-controlled oscillator 2 is divided and a part of the output is connected to the phase comparator 6 via the frequency divider 4. The TCXO 3 is connected to the phase comparator 6 via the frequency divider 5. The output of the phase comparator 6 is connected to the control voltage terminal 2d of the voltage-controlled oscillator 2 via the charging pump and loop filter in sequence. The frequency dividers 4 and 5, phase comparator 6, and charging pump 7 are not necessarily formed separately, typically being constructed in one PLL-IC.

Referring to the PLL circuit 1 of FIG. 7, because the oscillation frequency of the voltage-controlled oscillator 2 may not necessarily be attuned to an intended frequency in the initial state, the PLL circuit 1 is provided to adjust the oscillation frequency of the voltage-controlled oscillator 2. Adjustment of the oscillation frequency of the voltage-controlled oscillator 2 requires that a predetermined direct-current voltage be applied to the control voltage terminal 2d, and therefore the PLL circuit 1 in its entirety must be operated. That is, the oscillation frequency of the voltage-controlled oscillator must be adjusted while the PLL circuit is in operation.

The adjustment the oscillation frequency of the voltage-controlled oscillator 2 while the PLL circuit 1 is in operation requires a computer, or like equipment, for controlling the PLL circuit 1. The oscillation frequency adjustment also requires equipment for measuring the direct-current voltage applied to the control voltage terminal 2d, as well as a power source for operating the PLL circuit 1. Accordingly, the requirement for such measuring equipment gives rise to the drawback of increased equipment costs for the PLL circuit 1. Furthermore, it is necessary to perform the phase lock of the PLL circuit 1, which disadvantageously requires extra time for adjusting the oscillation frequency.

SUMMARY OF THE INVENTION

An object of the present invention is to provide a PLL circuit in which the oscillation frequency of the voltage-controlled oscillator can be quickly adjusted using fewer pieces of equipment before operating the PLL circuit in its entirety. Further objects of the present invention include the use of such a PLL circuit in a communication device, and also a method for frequency adjustment of the PLL circuit.

In order to attain the above-mentioned objects, a PLL circuit according to one embodiment of the present invention comprises a voltage-controlled oscillator having an oscillation frequency adjustment mechanism and a control voltage terminal, a charging pump, and a loop filter, wherein the output of the charging pump is connected to the control voltage terminal via the loop filter, and wherein a voltage application means for applying a direct-current voltage to the control voltage terminal is provided in the path from the output terminal of the charging pump to the control voltage terminal including the inside of the loop filter.

Further, in a PLL circuit according to another embodiment of the present invention, the voltage application means comprises a voltage application electrode and a wiring electrode connecting a point in the path from the output terminal of the charging pump to the control voltage terminal including the inside of the loop filter and the voltage application electrode.

Further, in a PLL circuit according to another embodiment of the present invention, a package having a plurality of terminal electrodes is provided, with one of the terminal electrodes defining the voltage application electrode.

Further, in a PLL circuit according to another embodiment of the present invention, a package having a plurality of terminal electrodes is provided, in which one of the terminal electrodes which is required only during operation of the PLL circuit defines the voltage application electrode, and the wiring electrode is formed so that the electrode can be disconnected.

Further, in a PLL circuit according to the present invention, the voltage application means comprises a voltage generation point for generating a direct-current voltage and a wiring electrode connecting the voltage generation point and a point in the path from the output terminal of the charging pump to the control voltage terminal including the inside of the loop filter, wherein the wiring electrode is formed so that the electrode can be disconnected.

Further, in a PLL circuit according to another embodiment of the present invention, the oscillation frequency adjustment mechanism of the voltage-controlled oscillator comprises an electrode which can be cut and trimmed, and the wiring electrode is made of the same material as that of the electrode in the oscillation frequency adjustment mechanism.

Further, in a communication device according to another embodiment of the present invention, the above PLL circuit is used.

Further, another embodiment of the present invention provides a frequency adjustment method of a PLL circuit including, a PLL circuit comprising a voltage-controlled oscillator having an oscillation frequency adjustment mechanism and a control voltage terminal, a charging pump, and a lop filter, wherein the output of the charging pump is connected to the control voltage terminal via the loop filter, and a voltage application means for applying a direct-current voltage to the control voltage terminal is provided in the path from the output terminal of the charging pump to the control voltage terminal including the inside of the loop filter; a step for applying a predetermined direct-current voltage to the control voltage terminal from the voltage application means, and a step for adjusting the oscillation frequency of the voltage-controlled oscillator by the oscillation frequency adjustment mechanism in a state that a predetermined direct-current voltage is applied to the control voltage terminal.

Further, another embodiment of the present invention provides a frequency adjustment method of a PLL circuit, wherein the voltage application means comprises a voltage application electrode and a wiring electrode connecting the voltage application electrode and a point of the path from the output terminal of the charging pump to the control voltage terminal including the inside of the loop filter.

Further, another embodiment of the present invention provides a frequency adjustment method of a PLL circuit including a package having a plurality of terminal electrodes is provided in the PLL circuit, and one of the terminal electrodes defines the voltage application electrode.

Further, another embodiment of the present invention provides a frequency adjustment method of a PLL circuit including a package having a plurality of terminal electrodes is provided in the PLL circuit, one of the terminal electrodes which is required only in operation defines the voltage application electrode, and the wiring electrode is formed so that the electrode can be disconnected, and a step for disconnecting the wiring electrode after the adjustment of the oscillation frequency of the voltage-controlled oscillator.

Further, another embodiment of the present invention provides a frequency adjustment method of a PLL circuit including the voltage application means comprises a voltage generation point for generating a direct-current voltage and a wiring electrode connecting the voltage generation point and a point in the path from the output terminal of the charging pump to the control voltage terminal including the inside of the loop filter, and a step for disconnecting the wiring electrode after the adjustment of the oscillation frequency of the voltage-controlled oscillator.

Further, another embodiment of the present invention provides a frequency adjustment method of a PLL circuit including the oscillation frequency adjustment mechanism of the voltage-controlled oscillator comprises an electrode which can be cut and trimmed, and the wiring electrode is made of the same material as that of the electrode in the oscillation frequency adjustment mechanism.

Further, in a PLL circuit constructed this way and in a frequency adjustment method of a PLL circuit according to the present invention, the oscillation frequency of a voltage-controlled oscillator can be quickly adjusted using fewer pieces of equipment.

Further, in a communication device according to the present invention, it is able to work for a device of lower cost.

BRIEF DESCRIPTION OF THE DRAWINGS

The invention will now be described in more detail with reference to the accompanying drawings, in which.

DESCRIPTION OF THE PREFERRED EMBODIMENT

Figure 1:
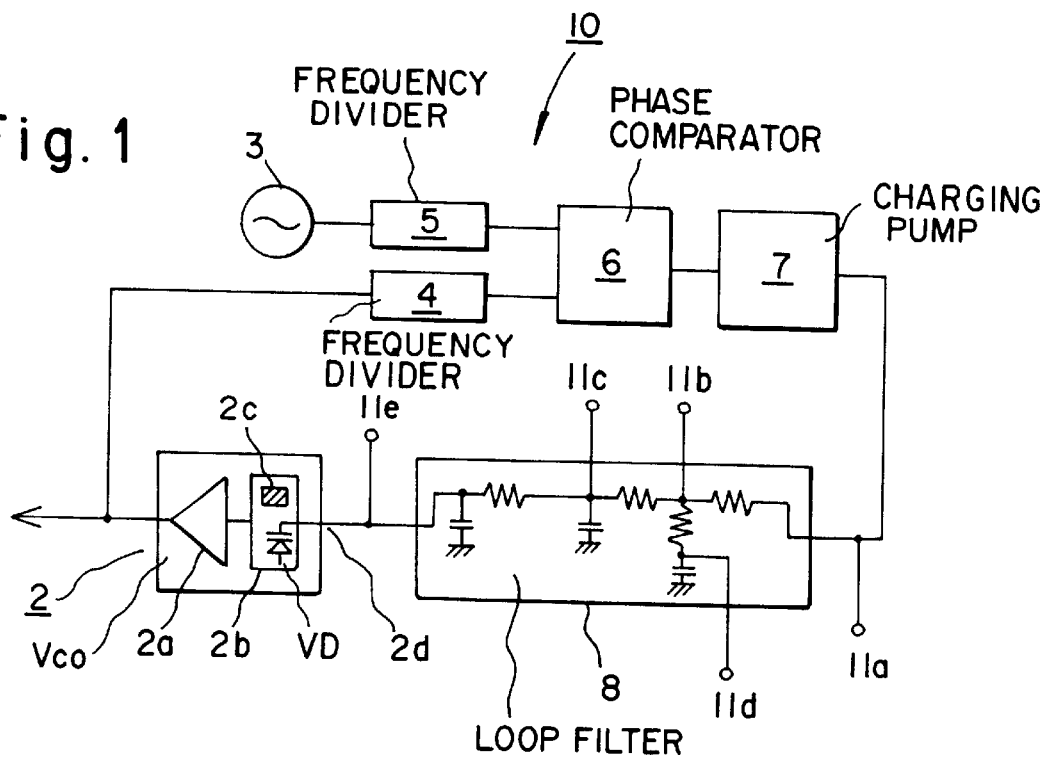
FIG. 1 is a block diagram showing one embodiment of a PLL circuit of the present invention.
Figure 7:
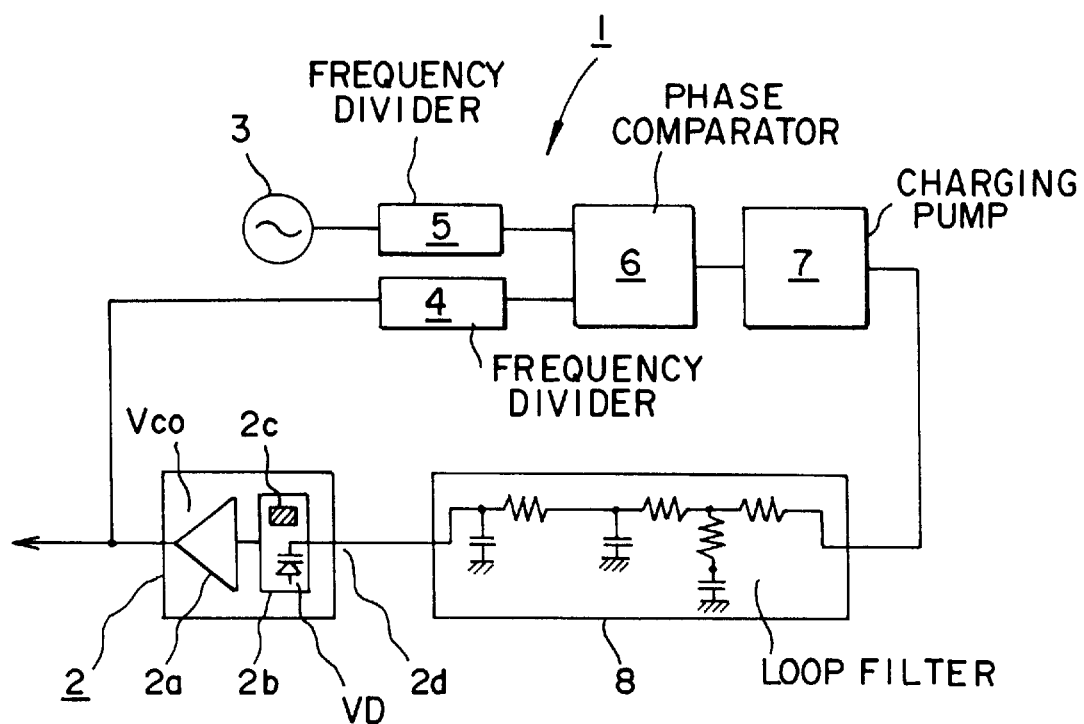
FIG. 7 is a block diagram showing a conventional PLL circuit.

FIG. 1 is an embodiment of a PLL circuit according to the present invention. In FIG. 1, the portions or components equivalent to those of FIG. 7 are labeled in a like manner, and their explanations may be omitted. As shown in FIG. 1, the path from the output terminal of a charging pump 7 of a PLL circuit 10 to a control voltage terminal 2d of a voltage-controlled oscillator 2 includes loop filter 8. The loop filter 8 includes voltage application means 11a, 11b, 11c, 11d, or 11e which are provided within the loop filter 8, the voltage application means 11a and 11e being connected to the nodes at both respective ends of the loop filter 8. There in a direct-current path via the loop filter 8 from each of the voltage application means 11a–e to the control voltage terminal 2d.

The voltage application means 11a–e need not be configured strictly as shown in FIG. 1 to include all five of voltage application means 11a–e. That is, it is not required that each of the five voltage application means 11a–e be configured at each position shown in the figure. For instance, the PLL circuit according to the present invention may be configured to operate with only one of the voltage application means 11a–e being provided at one of the five respective positions.

A direct-current voltage is applied at a one of the voltage application means 11a–e. The application of a direct-current voltage to one of the voltage application means 11a–e results in the control voltage terminal 2d being biased to a particular direct-current voltage. The level of the particular direct-current voltage at voltage terminal 2d is determined by components of the loop filter 8 through which the voltage application means 11a–e direct-current voltage passes. The direct-current voltage may be derived from a voltage supply line, a voltage supply circuit, a battery, or a like source, and may be applied directly or via a voltage divider network or like voltage processing circuitry. The voltage application means may be connected at other points other than 11a–e shown in FIG. 1 within the circuitry of the loop filter 8 or the PLL circuit 10, so long as the connected points achieve an equivalent voltage biasing function.

For the PLL circuit 10 constructed this manner, the oscillation frequency of the voltage-controlled oscillator 2 may be adjusted as follows. First, in the state that only the voltage-controlled oscillator 2 of the PLL circuit 10 operates and the frequency dividers 4 and 5, the phase comparator 6, and the charging pump 7 do not operate, that is, the state in which signals are neither inputted nor outputted to or from these devices, a predetermined direct-current voltage is applied at one or more of the voltage application means 11a–e. For instance, a single direct-current voltage may be applied to any one of voltage application means 11a, 11b, 11c, 11d or 11e. Application of the single direct-current voltage to one of the voltage application means 11a–e results in the control voltage terminal 2d of the voltage-controlled oscillator 2 being set to a certain level. Alternatively, two direct-current voltages may be applied to two of the voltage application means 11a–e. For instance, a first direct-current voltage could be applied to the voltage application means 11c, and another direct-current voltage could be applied to the voltage application means 11e. Note that the voltage application means 11e may have a resistance value associated with it (not shown), so as to result in a voltage divider between the direct-current voltages applied to the two voltage application means 11a–e (e.g., 11c and 11e). Application of the two direct-current voltages to voltage application means 11c and 11e results in the control voltage terminal 2d of the voltage-controlled oscillator 2 being set to a certain level.

In this way, the direct-current voltage from one of the voltage application means 11a–e is applied to the control voltage terminal 2d of the voltage-controlled oscillator 2. Since an input impedance of the control voltage terminal is very large, relatively little direct current flows into the control voltage terminal 2d.

In other words, the direct-current voltage from one of the voltage application means 11a–e may be applied to the control voltage terminal 2d without changing the direct-current voltage. Next, in this state, the oscillation frequency of the voltage-controlled oscillator 2 may be adjusted by cutting or trimming the trimming area 2c as a oscillation frequency adjustment mechanism of the voltage-controlled oscillator 2. Following these two steps, the oscillation frequency of the voltage-controlled oscillator 2 can be adjusted in the PLL circuit 10.

At this time, because the frequency dividers 4 and 5, the phase comparator 6, and the charging pump 7 do not operate, that is, the PLL circuit 10 in its entirety does not operate, equipment (e.g., a computer, or the like) for controlling is unnecessary. Further, because a predetermined direct-current voltage is applied at one of the voltage application means 11a–e, equipment for measuring a direct-current voltage applied to the control voltage terminal 2d is also unnecessary. In addition, since the phase lock is not required, the adjustment time may be shortened.

When the voltage application means 11a is used and the direct-current voltage applied is applied to the control voltage terminal 2d of the voltage-controlled oscillator 2 via a loop filter 8, the loop filter 8 functions as a noise filter. Because of this, for example, even if power source noise exists in the direct-current voltage to be applied to the voltage application means 11a, the noise will be removed by passing through the loop filter 8. Accordingly, a stable direct-current voltage can be applied to the control voltage terminal 2d, and adjustment of the oscillation frequency can be performed in a stable manner. Moreover, this filtering effect is obtained not only through use of the voltage application means 11a, but the same effect can be more or less obtained when the similar voltage application means 11b, 11c, and 11d are provided inside the loop filter 8.

In the case in which the voltage application means 11d is used, it may be necessary to satisfy a condition for direct-current impedance of the charging pump 7 as viewed from the output terminal of the charging pump 7. That is, the direct-current impedance of the charging pump 7 may be set to infinity (or to a high impedance), or to a stable known value, in order to control the direct-current voltage applied to the control voltage terminal 2d to a known value by way of the value of a direct-current voltage applied to the voltage application means 11d. In other words, the voltage applied to the voltage application means 11d affects the control voltage terminal 2d. Next, the construction of the voltage application means is shown as follows.

Figure 2:
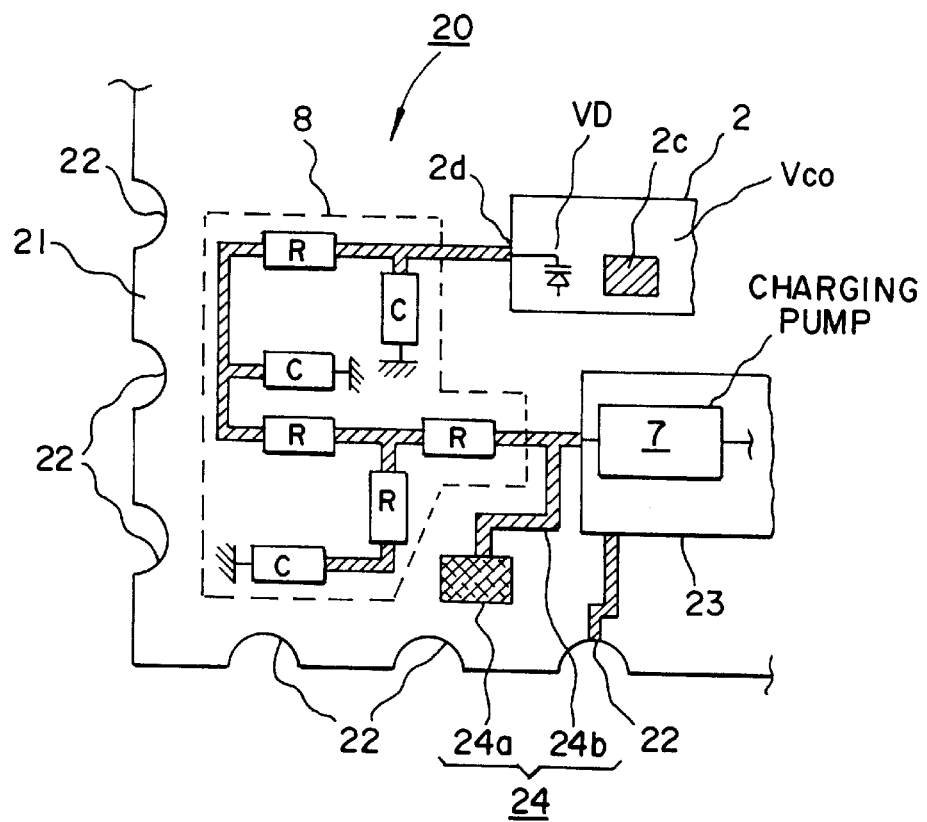
FIG. 2 is a plan view showing another embodiment of a PLL circuit of the present invention.

FIG. 2 is a PLL circuit according to another embodiment of the present invention. FIG. 2 is a plan view of a part of a PLL circuit constructed on a package board. In FIG. 2, the portions or components equivalent to those of FIG. 1 are labeled in a like manner, and their explanations may be omitted. The PLL circuit 20 is comprised of a voltage-controlled oscillator 2, a charging pump 7, and a loop filter 8 mounted on a package board 21. A plurality of terminal electrodes 22 are formed on the edge of the board 21. The charging pump 7 is formed inside a PLL-IC 23. In the PLL-IC 23, a frequency divider and/or phase comparator may also be included, but are not shown here.

A wiring electrode is formed from the PLL-IC 23 to one of the terminal electrodes 22. The terminal electrode with the wiring electrode connected is required to exchange of signals between the PLL-IC 23 and the outside circuit only when the PLL circuit 20 is in operation. In the loop filter 8, chip resistors R and chip capacitors C are connected through wiring electrodes. Between the charging pump 7 and loop filter 8, a voltage application means 24 is connected. The voltage application means 24 comprises a voltage application electrode 24a and a wiring electrode 24b connecting the voltage application electrode 24a and the wiring electrode between the charging pump 7 and the loop filter 8.

For the PLL circuit 20 constructed this manner, the oscillation frequency of the voltage-controlled oscillator 2 may be adjusted as follows. First, a power source voltage is applied to the PLL circuit 20 and a predetermined direct-current voltage is applied to the voltage application electrode 24a from the outside via a probe terminal. As is in the configuration of FIG. 1, the frequency dividers 4 and 5, the phase comparator 6, and the charging pump 7 do not operate.

The direct-current voltage applied to the voltage application electrode 24a is applied to the control voltage terminal 2d of the voltage-controlled oscillator 2 via the wiring electrode 24b and the loop filter 8. In this state, the oscillation frequency may be adjusted by cutting and trimming the trimming area 2c of the voltage-controlled oscillator 2. By means of these two steps in the PLL circuit 20, the oscillation frequency of the voltage-controlled oscillator 2 can be adjusted and the same effect as in the PLL circuit 10 can be obtained.

Figure 3:
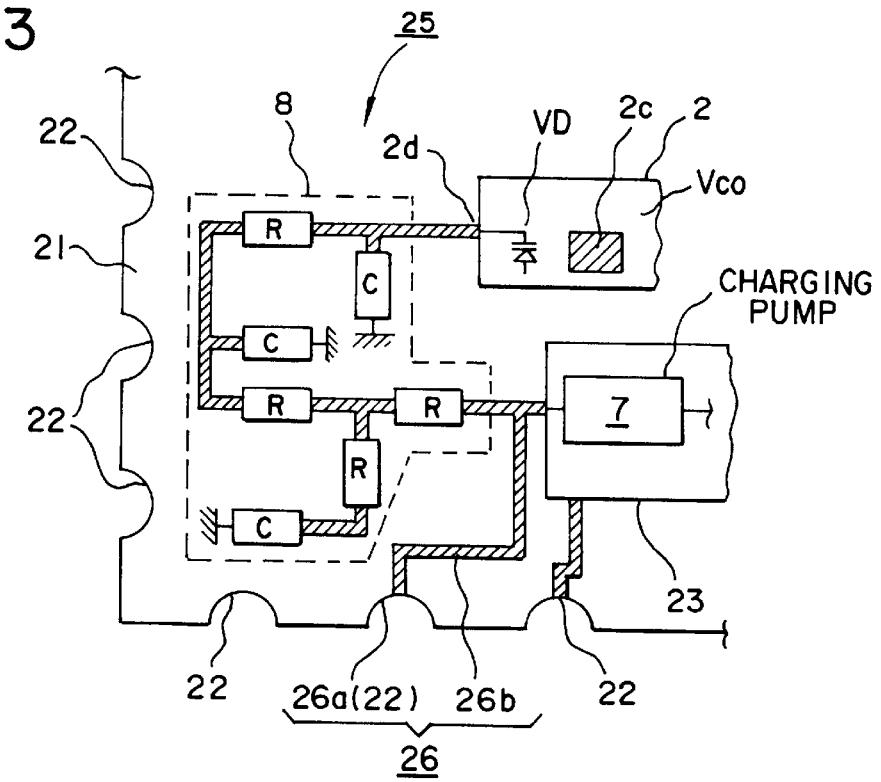
FIG. 3 is a plan view showing further another embodiment of a PLL circuit of the present invention.

FIG 3. is another embodiment of a PLL circuit according to the present invention. In FIG. 3, the portions or components equivalent to those of FIG. 2 are labeled in a like manner, and their explanations may be omitted. As shown in FIG. 3, a voltage application means 26 is connected between a charging pump 7 and loop filter 8 of a PLL circuit 25. The voltage application means 26 comprises a voltage application electrode 26a and a wiring electrode 26b connecting the voltage application electrode 26a and the wiring electrode between the charging pump 7 and the loop filter 8. The voltage application electrode 26a defines one of terminal electrodes 22 formed on the package board 21. In the PLL circuit 25, the terminal electrode 22 defined as the voltage application electrode 26a is not used except at the time when the oscillation frequency of the voltage-controlled oscillator 2 is adjusted.

For the PLL circuit 25 constructed in this manner, the oscillation frequency of the voltage-controlled oscillator 2 may be adjusted as follows. First, a power source voltage is applied to the PLL circuit 25 and a predetermined direct-current voltage is applied to the voltage application electrode 26a from the outside. The direct-current voltage applied to the voltage application electrode 26a is applied to the control voltage terminal 2d of the voltage-controlled oscillator 2 via the wiring electrode 26b and the loop filter 8. In this state, the oscillation frequency may be adjusted by cutting and trimming the trimming area 2c of the voltage-controlled oscillator 2. By means of these two steps, in the PLL circuit 25 the oscillation frequency of the voltage-controlled oscillator 2 can be adjusted and the same effect as in the PLL circuit 20 can be obtained.

Configuring the PLL circuit 25 this way with one of the terminal electrodes 22 defined as the voltage application electrode 26a, ordinary measuring devices can be used in the measurement of the PLL circuit 25, in application of the direct-current voltage to the voltage application electrode 26a. That is, no special probe terminal, special measuring equipment, or the like, are required. Since no special equipment is needed when the oscillation frequency of the voltage-controlled oscillator 2 is adjusted, the equipment cost can be further reduced in comparison with that in the PLL circuit 20.

Figure 4:
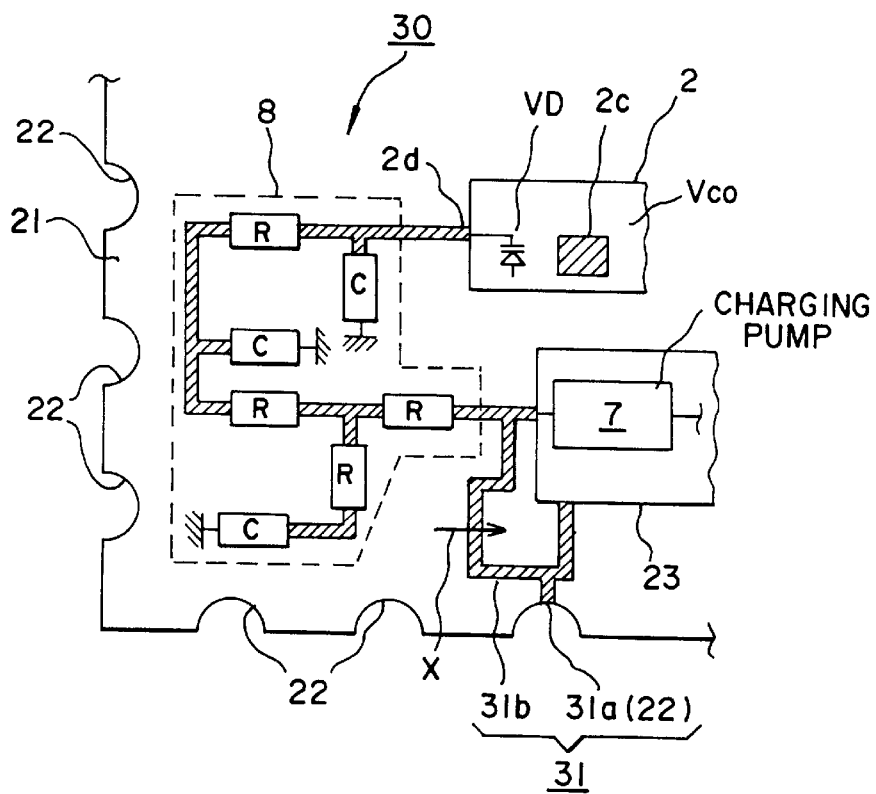
FIG. 4 is a plan view showing further another embodiment of a PLL circuit of the present invention.

FIG. 4 is another embodiment of a PLL circuit according to the present invention. In FIG. 4, the portions or components equivalent to those of FIG. 3 are labeled in a like manner, and their explanations may be omitted. In FIG. 4, a voltage application means 31 is connected between a charging pump of a PLL circuit 30 and a loop filter 8. The voltage application means 31 comprises a voltage application electrode 31a and a wiring electrode 31b connecting the voltage application electrode 31 and the wiring electrode between the charging pump 7 and the loop filter 8. Among terminal electrodes 22 formed on a board 21, the terminal electrode 22 connected to a PLL-IC 23 defines the voltage application electrode 31a. The terminal electrode 22 serving as the voltage application electrode 31a is needed to exchange signals between the PLL-IC 23 and the external circuit when the PLL circuit 30 is in operation, but when the operation of the PLL-IC 23 is not required the terminal electrode 22 is unnecessary.

For the PLL circuit 30 constructed this manner, the oscillation frequency of the voltage-controlled oscillator 2 may be adjusted as follows. First, the two steps in the adjustment of the oscillation frequency are the same as the two steps in the PLL circuit 25 shown in FIG. 3. After the adjustment of the oscillation frequency, the wiring electrode 31b which disturbs the operation of the PLL circuit 30 is disconnected, for example, at the location shown by a disconnecting line X. According to these three steps, the oscillation frequency of the voltage-controlled oscillator 2 can be adjusted in the PLL circuit 30, and the same effect as that in the PLL circuit 25 can be obtained.

In constructing the PLL circuit 30 this way, there is no need for a terminal electrode to be exclusively used as a voltage application electrode on the board 21. Thus, the board 21 may be reduced in sized as compared with that in the PLL circuit 25, and further, the PLL circuit 30 can be reduced in size as well.

Figure 5:
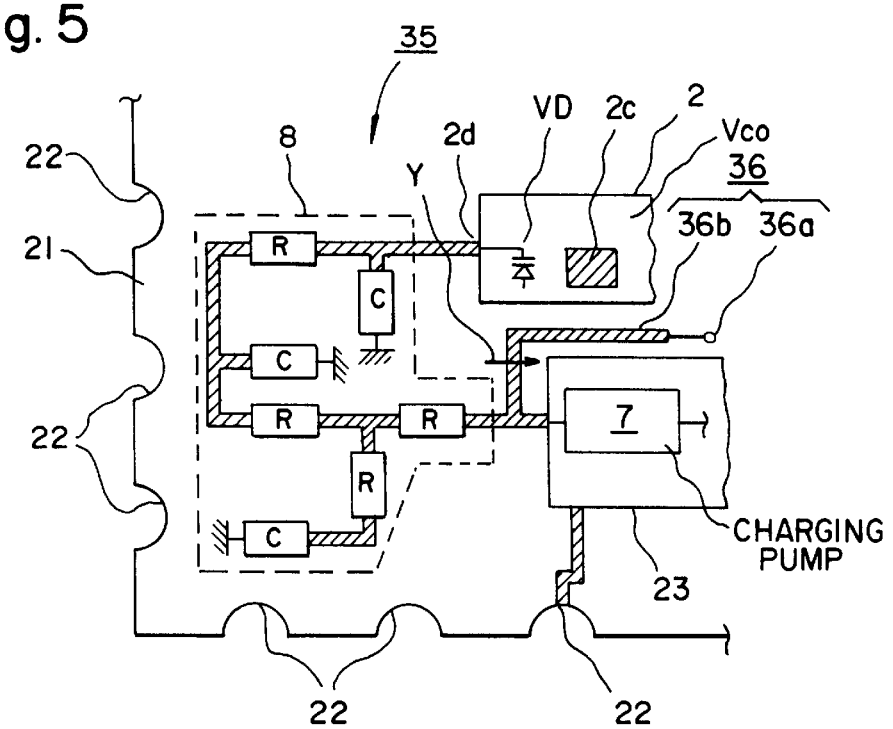
FIG. 5 is a plan view showing further another embodiment of a PLL circuit of the present invention.

FIG. 5 is another embodiment of a PLL circuit according to the present invention. In FIG. 5, the portions or components equivalent to those of FIG. 4 are labeled in a like manner, and their explanations may be omitted. In FIG. 5, a voltage application means 36 is connected between a charging pump 7 and a loop filter 8. The voltage application means 36 comprises a voltage generation point 36a for generating a predetermined direct-current voltage and a wiring electrode 36b connecting the voltage generation point 36a and the wiring electrode between the charging pump 7 and the filter 8. The voltage generation point 36a means may be, for example, an internal power source for providing a predetermined direct-current voltage different than the power source voltage with some of the components inside the PLL circuit 35 in the state that the power source voltage is applied to the PLL circuit 35.

For the PLL circuit 35 constructed this manner, the oscillation frequency of the voltage-controlled oscillator 2 may be adjusted as follows. First, a power source voltage is applied to the PLL circuit 35. Because of this, a different stable direct-current voltage is generated at the voltage generation point 36 and applied to the control voltage terminal 2d of the voltage-controlled oscillator 2 via the wiring electrode 36b and loop filter 8.

In this state, the oscillation frequency may be adjusted by cutting and trimming the trimming area 2c of the voltage-controlled oscillator. After the adjustment of the oscillation frequency of the voltage-controlled oscillator 2, since the applied voltage from the voltage generation point 36a disturbs the operation of the PLL circuit 35, the wiring electrode 36 may be disconnected, for example, at the location shown by a disconnecting line Y. According to these three steps, the oscillation frequency of the voltage-controlled oscillator 2 can be adjusted in the PLL circuit 35.

Constructing the PLL circuit 35 in this way eliminates the need for an extra power source disposed outside the PLL circuit for generating a direct-current voltage to be applied to the control voltage terminal 2d. Thus, the equipment cost can be further reduced. Further, because the voltage application means is only the wiring electrode 36b, the space for providing a voltage application electrode and the terminal electrode is unnecessary. Accordingly, a smaller sized PLL circuit can be achieved.

In the PLL circuits 30 and 35, for example, when a method of laser cutting is used as a trimming or eliminating means, if the trimming area of the voltage-controlled oscillator 2 and the wiring electrode 31b or 36b are made of different materials, it may be necessary to set the condition of the laser differently. However, when the trimming area 2c of the voltage-controlled oscillator 2 and the wiring electrode 31b or 36b are made of the same material, the adjustment of the oscillation frequency and the cutting of the wiring electrode 31b or 36b can be done using the same equipment. In this way, equipment costs can be further reduced. Moreover, the equipment to be used in adjustment of the oscillation frequency and cutting of the wiring electrode in this case is not limited to laser-related equipment. That is, if the equipment may be a type of mechanical cutting equipment, the electrode will show the same effect.

Figure 6:
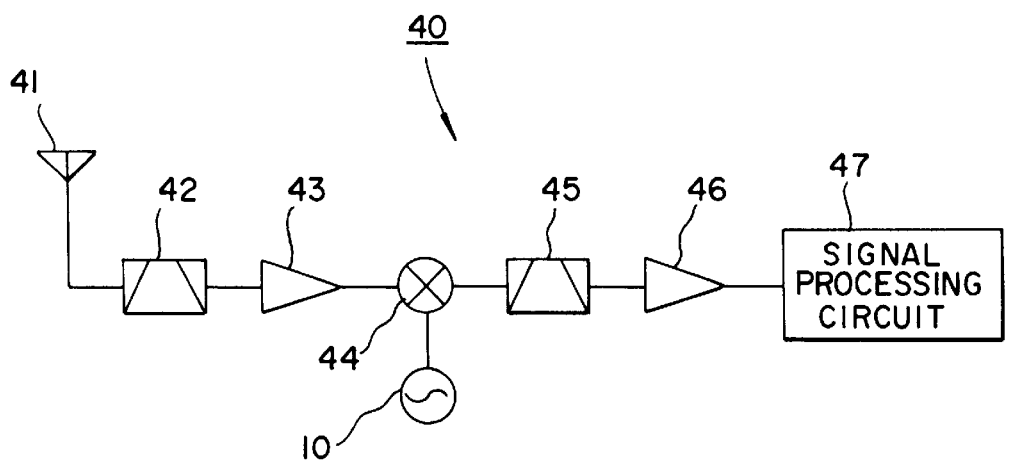
FIG. 6 is a block diagram showing one embodiment of a communication device of the present invention.

FIG. 6 is an embodiment of a communication device according to the present invention. FIG. 6 shows a block diagram of the receiving circuit portion of a communication device using a PLL circuit 10 of FIG. 1. In FIG. 6, a communication device 40 comprises an antenna 41, a filter 42, an amplifier 43, a PLL circuit 10, a mixer 44, a filter 45, an amplifier 46, and a signal processing circuit 47. The antenna 41 is connected to the mixer 44 via the filter 42 and the amplifier 43. The PLL circuit 10 is also connected to the mixer 44. The output of the mixer 44 is connected to the signal processing circuit 47 via the filter 45 and the amplifier 46.

In the communication device 40 constructed this way, high-frequency RF signal is received at the antenna. Unwanted signal in the RF signal is removed in the filter 42. The RF signal is amplified in the amplifier 43 and output to the mixer. On the other hand, a local signal generated in the PLL circuit 10 is also input to the mixer 44. The mixer 44 mixes the two input signals and output an IF signal of the difference frequency between two input signals. The IF signal is output from the mixer 44. Unwanted signal in the IF signal is removed in the filter 45. The IF signal is amplified in the amplifier 46 and input to the signal processing circuit 47. In the signal processing circuit 47, the information contained in the input signal is taken out by demodulation.

Since an accurate frequency signal is output from the PLL circuit 10, the accuracy of the frequency of the IF signal output from the mixer is increased. This reduces errors in the demodulation of signals in the signal processing circuit 47. Accordingly, the circuit added for error correction, and like circuitry, can be simplified to lower design and manufacturing costs. In this way, through use of a PLL circuit according to the present invention, a low-cost communication device 40 can be achieved.

Moreover, in addition to using the PLL circuit 10 in FIG. 1 in the communication device 40, the PLL circuits 20, 25, 30, and 35 shown in FIGS. 2 through 5 may alternatively be used. Thus, the advantages of each embodiment can be obtained.

According to a PLL circuit and a frequency adjustment method of a PLL circuit of the present invention, a PLL circuit may be arranged such that a voltage application means for applying a direct-current voltage to the control voltage terminal is provided in the path from the output terminal of a charging pump to a control voltage terminal of a voltage-controlled oscillator including the inside of a loop filter, and, by first applying a predetermined direct-current voltage to the control voltage terminal from the voltage application means, and next adjusting the oscillation frequency of the voltage-controlled oscillator through an oscillation frequency adjustment mechanism under the condition that a predetermined direct-current voltage is applied to the control voltage terminal, the oscillation frequency of the voltage-controlled oscillator can be quickly adjusted using fewer pieces of equipment.

By providing a package of a plurality of terminal electrodes with a PLL circuit and one of the terminal electrodes defining a voltage application electrode, the equipment cost can be reduced. In addition, by providing a package of a plurality of terminal electrodes with a PLL circuit, and by one of the terminal electrodes which is required only in operation defining a voltage application electrode, forming a wiring electrode so that the wiring electrode can be disconnected, and cutting the wiring electrode after the adjustment of the oscillation frequency, a PLL circuit of reduced size can be obtained.

Furthermore, by a voltage application means comprising a voltage generation point for generating a direct-current voltage and a wiring electrode connecting the voltage generation point and a point in the path from the output terminal of a charging pump to a control voltage terminal, forming the wiring electrode so that the wiring electrode can be disconnected, and cutting the wiring electrode after the adjustment of the oscillation frequency, the equipment cost can be further reduced and a PLL circuit of reduced size can be obtained.

Finally, according to a communication device of the present invention, other circuits except the PLL circuit can also be simplified, thus lowering costs.

Those skilled in the art will appreciate that the present invention can be embodied in other specific forms without departing from the spirit or essential characteristics thereof.

What is claimed is:

1. A PLL circuit comprising:
   a voltage-controlled oscillator having an electrode which can be trimmed and a control voltage terminal;
   a charging pump; and
   a loop filter,
      wherein the output of the charging pump is connected to the control voltage terminal via the loop filter, and wherein a voltage application means for applying a direct-current voltage to the control voltage terminal is provided in the path from the output terminal of the charging pump to the control voltage terminal including the inside of the loop filter.

2. A PLL circuit as claimed in claim 1, wherein the voltage application means further comprises
   a voltage application electrode; and
   a wiring electrode connecting the voltage application electrode and any point in the path from the output terminal of the charging pump to the control voltage terminal including the inside of the loop filter.

3. A PLL circuit as claimed in claim 2, wherein the PLL circuit includes a package having a plurality of terminal electrodes, and one of the terminal electrodes defines the voltage application electrode.

4. A PLL circuit as claimed in claim 2, wherein the PLL circuit includes a package having a plurality of terminal electrodes, wherein one of the terminal electrodes which is required only in operation defines the voltage application electrode, and the wiring electrode is formed so that the electrode can be disconnected.

5. A PLL circuit as claimed in claim 1, wherein the voltage application means further comprises
   a voltage generation point for generating a direct-current voltage; and
   a wiring electrode connecting the voltage generation point and any point in the path from the output terminal of the charging pump to the control voltage terminal including the inside of the loop filter,
      wherein the wiring electrode is formed so that the electrode can be disconnected.

6. A PLL circuit as claimed in claim 4 or 5, wherein the wiring electrode is made of the same material as that of the electrode which can be trimmed.

7. A communication device, wherein a PLL circuit as claimed in claim 1 is used.

8. A frequency adjustment method of a PLL circuit comprising,
   the PLL circuit comprising a voltage-controlled oscillator having an electrode which can be trimmed and a control voltage terminal, a charging pump, and a loop filter, wherein the output of the charging pump is connected to the control voltage terminal via the loop filter, and wherein a voltage application means for applying a direct-current voltage to the control voltage terminal is provided in the path from the output terminal of the charging pump to the control voltage terminal including the inside of the loop filter, the method the comprising steps of:
      a step for applying a predetermined direct-current voltage to the control voltage terminal from the voltage application means, and
      a step for adjusting the oscillation frequency of the voltage-controlled oscillator by the electrode which can be trimmed in a state that a predetermined direct-current voltage is applied to the control voltage terminal.

9. A frequency adjustment method of a PLL circuit as claimed in claim 8, wherein the voltage application means comprises
a voltage application electrode; and
a wiring electrode connecting the voltage application electrode and any point in the path from the output of the charging pump to the control voltage terminal including the inside of the loop filter.

10. A frequency adjustment method of a PLL circuit as claimed in claim 9, wherein the PLL circuit includes a package having a plurality of terminal electrodes, and one of the terminal electrodes defines the voltage application electrode.

11. A frequency adjustment method of a PLL circuit as claimed in claim 9, wherein the PLL circuit includes a package having a plurality of terminal electrodes, and one of the terminal electrodes which is required only in operation defines the voltage application electrode, and the wiring electrode is formed so that the electrode can be disconnected, and
further comprising a step for disconnecting the wiring electrode after the adjustment of the oscillation frequency of the voltage-controlled oscillator.

12. A frequency adjustment method of a PLL circuit as claimed in claim 8, wherein the voltage application means comprises
a voltage generation point for generating a direct-current voltage; and
a wiring electrode connecting the voltage generation point and any point in the path from the output terminal of the charging pump to the control voltage terminal including the inside of the loop filter, and
further comprising a step for disconnecting the wiring electrode after the adjustment of the oscillation frequency of the voltage-controlled oscillator.

13. A frequency adjustment method of a PLL circuit as claimed in claim 11 or 12, wherein the wiring electrode is made of the same material that of the electrode which can be trimmed.

14. A PLL circuit comprising:
a voltage-controlled oscillator having an electrode which can be trimmed and a control voltage terminal;
a charging pump;
a loop filter connected to the charging pump, the loop filter being disposed between the control voltage terminal of the voltage-controlled oscillator and the charging pump; and
voltage application means connected to at least one point within the loop filter, there being an direct-current path from the voltage application means to the control voltage terminal via the loop filter;
wherein a direct-current voltage being applied to the voltage application means biases the control voltage terminal to a voltage level.

15. The PLL circuit as claimed in claim 14, wherein the voltage application means further comprises:
a first voltage application electrode connected to a point within the loop filter by a first wiring electrode.

16. The PLL circuit as claimed in claim 15, wherein the voltage application means further comprises:
a second voltage application electrode connected to a point within the loop filter by a second wiring electrode.

17. The PLL circuit as claimed in claim 15, wherein the PLL circuit further comprises:
a package having a plurality of terminal electrodes, one of the plurality of terminal electrodes defining the first voltage application electrode.

18. The PLL circuit as claimed in claim 15, wherein the PLL circuit further comprises:
a package having a plurality of terminal electrodes, one of the plurality of terminal electrodes defining the first voltage application electrode, the one of the plurality of terminal electrodes being required only during operation of the PLL circuit;
wherein the first wiring electrode is formed so that it can be disconnected.

19. The PLL circuit as claimed in claim 14, wherein the voltage application means further comprises:
a voltage generation point for generating a direct-current voltage.

20. The PLL circuit as claimed in claim 16, wherein the first and second wiring electrodes are made of the same material as that of the electrode which can be trimmed.

21. A PLL circuit in a communication device, the PLL circuit comprising:
a voltage-controlled oscillator having an electrode which can be trimmed and a control voltage terminal;
a charging pump;
a loop filter connected to the charging pump, the loop filter being disposed between the control voltage terminal of the voltage-controlled oscillator and the charging pump;
voltage application means within the loop filter, there being a direct-current path from the voltage application means to the control voltage terminal via the loop filter; and
a battery which serves as a source of a direct-current voltage;
wherein the direct-current voltage is applied to the voltage application means to bias the control voltage terminal to a voltage level.

22. A method of adjusting a frequency of a PLL circuit having a loop filter, voltage application means, and a voltage-controlled oscillator having a control voltage terminal and an electrode which can be trimmed, the method comprising steps of:
providing a direct-current voltage path from the voltage application means to the control voltage terminal via the loop filter; and
applying a predetermined direct-current voltage to the voltage application means which results in a biasing the control voltage terminal to a voltage level.

23. The method of claim 22 wherein the voltage application means comprises a first voltage application electrode and a second voltage application electrode, the method comprising steps of:
applying a first predetermined direct-current voltage to the first voltage application electrode; and
applying a second predetermined direct-current voltage to the second voltage application electrode;
wherein the steps of applying a first predetermined direct-current voltage and applying a second predetermined direct-current voltage results in biasing the control voltage terminal to a voltage level.

24. The method of claim 22 wherein the step of applying a predetermined direct-current voltage comprises connecting a wiring electrode.

25. The method of claim 24 further comprising a step of:
disconnecting the wiring electrode after adjustment of the oscillation frequency of the voltage-controlled oscillator.

* * * * *